(12) United States Patent
Barnett et al.

(10) Patent No.: US 7,190,214 B2
(45) Date of Patent: Mar. 13, 2007

(54) AMPLIFIER APPARATUS FOR USE WITH A SENSOR

(75) Inventors: Raymond Elijah Barnett, Apple Valley, MN (US); Craig Matthew Brannon, Maplewood, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/765,599

(22) Filed: Jan. 27, 2004

(65) Prior Publication Data

US 2005/0162221 A1 Jul. 28, 2005

(51) Int. Cl.
*G06G 7/12* (2006.01)
(52) U.S. Cl. .......................... 327/563; 327/67
(58) Field of Classification Search ............... 327/560, 327/563, 63, 65, 67; 330/259, 260; 360/46, 360/67, 68, 328
See application file for complete search history.

(56) References Cited

U.S. PATENT DOCUMENTS

| | | | |
|---|---|---|---|
| 5,559,646 A | 9/1996 | Voorman et al. | 360/67 |
| 6,667,842 B2 * | 12/2003 | Comeau et al. | 360/67 |
| 6,707,625 B2 * | 3/2004 | Leighton et al. | 360/46 |
| 2002/0154435 A1 * | 10/2002 | Comeau et al. | 360/67 |

OTHER PUBLICATIONS

Veenstra, Hugo; Mulder, Jan; Le, Iuan; and Grillo, Giuseppe; A 1 Gb/s Read/Write-Preamplifier for Hard-Disk-Drive Applications; IEEE Solid-State Circuits Conference, Feb. 2001; Session 12, Signal Processing for Storage and Coding.

* cited by examiner

*Primary Examiner*—Long Nguyen
(74) *Attorney, Agent, or Firm*—W. James Brady; Frederick J. Telecky, Jr.

(57) ABSTRACT

An apparatus for use with a sensor includes first and second signal treating circuit segments coupled with the sensor for presenting a substantially balanced differential signaling representation of output signals from the sensor. Each respective signal treating circuit segment comprises a plurality of circuit elements having different electrical symmetries coupled in parallel and establishing a plurality of parallel signal paths having asymmetric signal handling characteristics. A feedback circuit is coupled with the first and second signal treating circuit segments and provides feedback signals to selected circuit elements in each of the first and second signal treating circuit segments. The feedback signals effect substantially balanced signal handling among the selected circuit elements having similar electrical symmetries.

6 Claims, 4 Drawing Sheets

AMPLIFIER APPARATUS FOR USE WITH A SENSOR

BACKGROUND OF THE INVENTION

The present invention is directed to signal amplifiers used with a sensor such as a read head in an information storage device, and especially to such signal amplifiers for which some control is available regarding certain operating parameters associated with the amplifier.

There are many important goals in designing and operating an amplifier for use with a sensor, two such goals are: low band pass corner frequency and low noise. Sensors such as magneto-resistive sensing elements require a direct current (DC) bias applied across them to operate correctly. The presence of such a DC bias may cause problems if the DC signal is passed on to amplifying elements. A low band pass corner frequency permits sensing of lower frequency signals while still rejecting DC signals and therefore contributes to a truer sensing of signals indicated by the sensor. Lower noise is desirable to reduce noise attributable to the sensor's read back signal.

Prior art signal amplifiers, especially signal amplifiers for use with a read head in an information storage device, have resulted in a compromise in noise performance when a very low band pass corner is needed.

There is a need for a signal amplifier apparatus that accommodates design for both low band pass corner frequency and lower noise.

SUMMARY OF THE INVENTION

An apparatus for use with a sensor includes first and second signal treating circuit segments coupled with the sensor for presenting a substantially balanced differential signaling representation of output signals from the sensor. Each respective signal treating circuit segment comprises a plurality of circuit elements having different electrical symmetries coupled in parallel and establishing a plurality of parallel signal paths having asymmetric signal handling characteristics. A feedback circuit is coupled with the first and second signal treating circuit segments and provides feedback signals to the circuit elements in each of the first and second signal treating circuit segments. The feedback signals effect substantially balanced signal handling among circuit elements having similar electrical symmetries.

It is, therefore, an object of the present invention to provide a signal amplifier apparatus that accommodates design for both low band pass corner frequency and lower noise.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
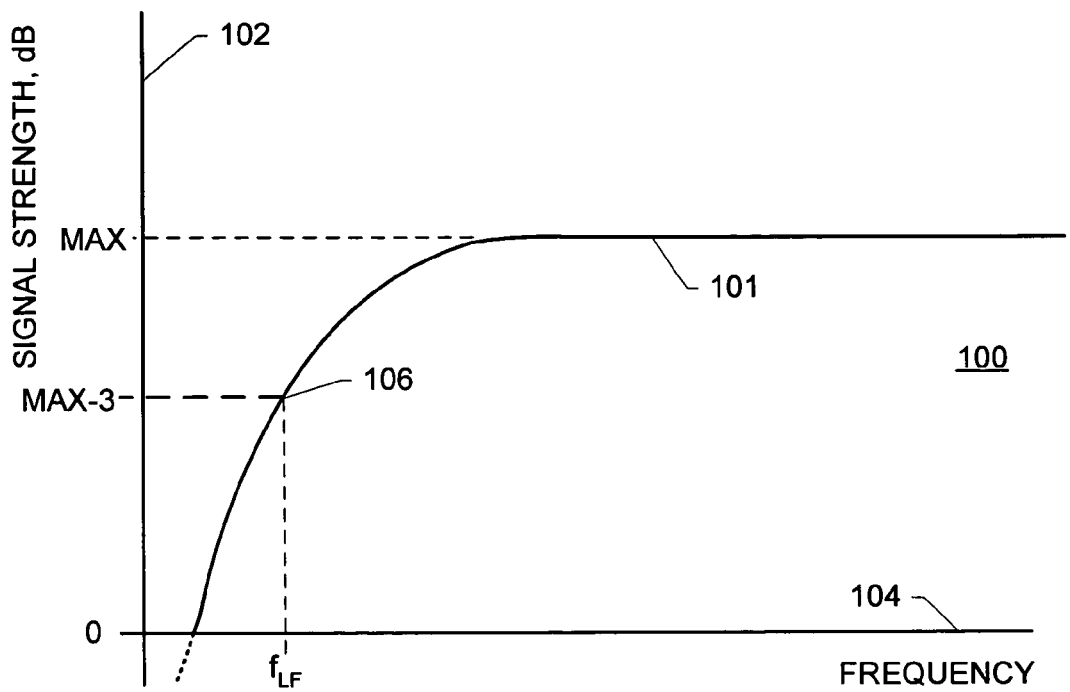
FIG. 1 is a graphic representation of an amplifier output transfer function.

FIG. 1 is a graphic representation of an amplifier output transfer function. In FIG. 1, a graphic plot 100 includes a frequency response curve 101 is plotted against a vertical axis 102 representing signal strength in decibels (dB) and plotted against a horizontal axis 104 representing frequency in a parameter appropriate for the circuit or device involved, such as megaHertz (MHz; not indicated in FIG. 1). Curve 101 varies up to a maximum signal strength of max dB. Curve 101 achieves a signal of MAX −3 dB at a frequency $f_{LF}$. The frequency at a point 106 at which a frequency response curve (e.g., curve 101) is at a −3 dB signal level at the left end of the frequency response is commonly referred to as the low corner frequency of the frequency response curve. Frequency $f_{LF}$ is the low corner frequency of frequency response curve 101. In designing an amplifier circuit for a sensor, such as a read head, it is advantageous to establish low corner frequency $f_{LF}$ as low as possible to permit the amplifier to respond to as low a frequency signal from the sensor as can be achieved without passing DC signals.

Figure 2:
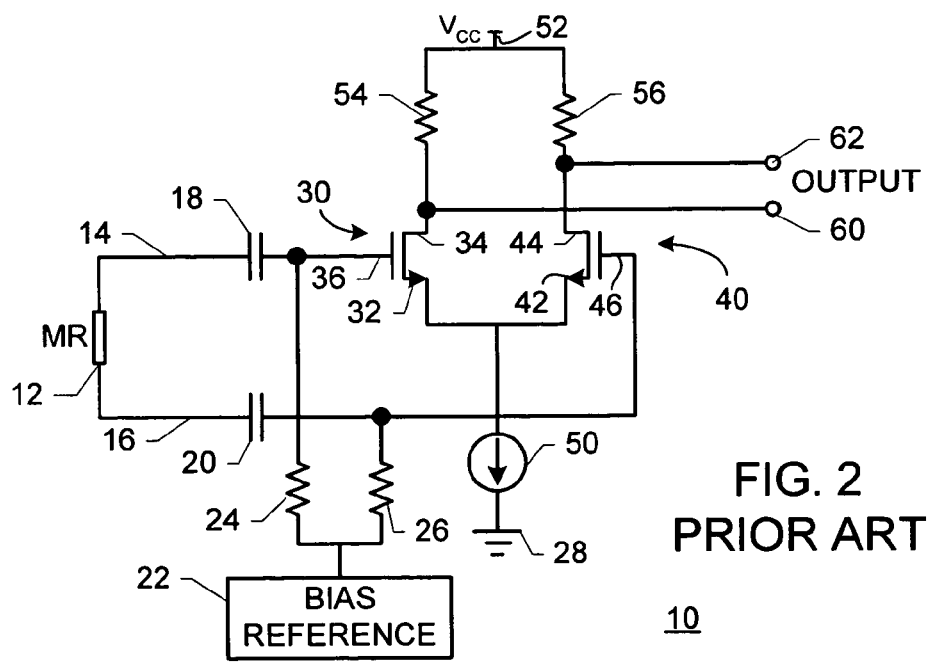
FIG. 2 is an electrical schematic illustration of a first example of a prior art differential amplifier for use with a read head.

FIG. 2 is an electrical schematic illustration of a first example of a prior art differential amplifier for use with a read head. In FIG. 2, a read amplifier circuit 10 (sometimes also referred to as a read front-end) is attached to a magneto-resistive element 12 via connection leads 14, 16 connected in parallel. A capacitor 18 is coupled with connection lead 14. A capacitor 20 is coupled with connection lead 16. Capacitors 18, 20 block low frequency signals that appear on connection leads 14, 16.

Metal-oxide silicon (MOS) transistor 30 has a source 32, a drain 34 and a gate 36. Metal-oxide silicon (MOS) transistor 40 has a source 42, a drain 44 and a gate 46. Sources 32, 42 are coupled in common and with a ground locus 28 via a current source 50. Gate 36 is coupled with connection lead 14 via capacitor 18 and gate 46 is connected with connection lead 16 via capacitor 20. A bias reference source 22 is connected via resistors 24, 26 to establish a predetermined bias potential at gates 36, 46. Drain 34 is coupled with a supply voltage $V_{CC}$ at a supply voltage locus 52 via a resistor 54. Drain 44 is coupled with supply voltage $V_{CC}$ at supply voltage locus 52 via a resistor 56. Output signals are taken from drains 34, 44 and presented at output loci 60, 62.

Amplifier circuit 10 advantageously permits setting low corner frequency $f_{LF}$ (FIG. 1) by resistors 24, 26 and capacitors 18, 20 according to the relationship:

$$f_{LF} \sim \frac{1}{2\pi RC} \quad [1]$$

where ~ indicates proportional to;
R is the resistance value of resistors 24, 26; and
C is the capacitance of capacitors 18, 20.

A further advantage of amplifier circuit 10 is that setting of low corner frequency $f_{LF}$ is independent of the currents or physical dimensions of MOS transistors 30, 40.

A disadvantage of amplifier circuit 10 is that it requires that MOS transistors 30, 40 be large in order to limit noise at the input of amplifier circuit 10—e.g., at gates 36, 46, and a large MOS transistor 30, 40 will provide large input capacitance so that gates 36, 46 establish a capacitive divider that will effect significant attenuation on all frequency signals. Another disadvantage of amplifier circuit 10 is that a low noise design of amplifier circuit 10 requires that a large bias current be provided by current source 50 that contrasts the desire for low power.

Figure 3:
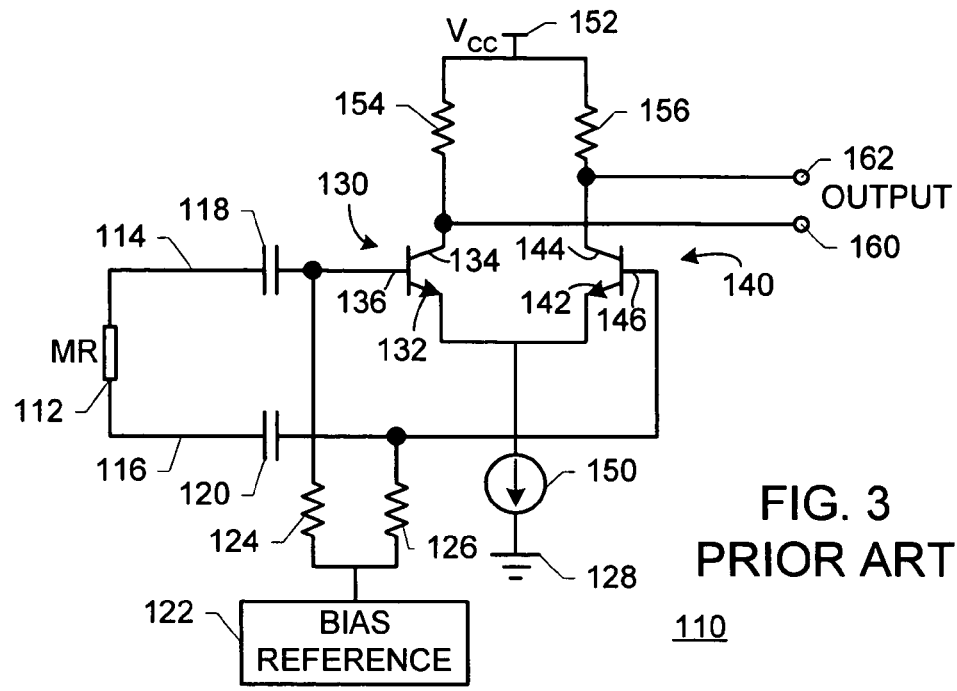
FIG. 3 is an electrical schematic illustration of a second example of a prior art differential amplifier for use with a read head.

FIG. 3 is an electrical schematic illustration of a second example of a prior art differential amplifier for use with a read head. In FIG. 3, a read amplifier circuit 110 (sometimes also referred to as a read front-end) is attached to a magneto-resistive element 112 via connection leads 114, 116 connected in parallel. A capacitor 118 is coupled with connection lead 114. A capacitor 120 is coupled with connection lead 116. Capacitors 118, 120 block low frequency signals that appear on connection leads 114, 116.

Bipolar transistor 130 has an emitter 132, a collector 134 and a base 136. Bipolar transistor 140 has an emitter 142, a collector 144 and a base 146. Emitters 132, 142 are coupled in common and with a ground locus 128 via a current source 150. Base 136 is coupled with connection lead 114 and base 146 is connected with connection lead 116. A bias reference source 122 is connected via resistors 124, 126 to establish a predetermined bias potential at bases 136, 146. Collector 134 is coupled with a supply voltage $V_{CC}$ at a supply voltage locus 152 via a resistor 154. Collector 144 is coupled with supply voltage $V_{CC}$ at supply voltage locus 152 via a resistor 156. Output signals are taken from collectors 134, 144 and presented at output loci 160, 162.

Amplifier circuit 110 advantageously requires less bias current than amplifier 10 (FIG. 2) because bipolar transistors 130, 140 usually require less bias current than MOS transistors 30, 40 (FIG. 2) for the same noise performance. Further, bipolar transistors 130, 140 are physically smaller (i.e., require less die space) than MOS transistors 30, 40 (FIG. 2) for a given noise level.

A disadvantage of amplifier 110 vis-à-vis amplifier 10 is that amplifier 110 has a low corner frequency $f_{LF}$ and noise level that are both functions of the bipolar device collector current $I_C$ and are in opposing relationship. In order to achieve low noise, collector current IC varies according to the relationship:

$$V_{NOISE} = 4kT\left(r_b + \frac{V_T}{2I_C}\right) \quad [2]$$

Where $V_{NOISE}$ is voltage level of noise present;
k is Boltzmann's constant;
T is temperature;
$r_b$ is related to transistor emitter geometry;
$V_T$ is transconductance voltage of a bipolar transistor; and
$I_C$ is collector current of a bipolar transistor.

Requiring high $I_C$ conflicts with the need for high $r_\pi$ to yield a low corner frequency $f_{LF}$ according to the relationships:

$$r_\pi = \beta \cdot \frac{V_T}{I_C} \quad [3]$$

Where β is current gain of a bipolar transistor;
$V_T$ is transconductance voltage of a bipolar transistor; and
$I_C$ is collector current of a bipolar transistor.

$$f_{LF} \sim \frac{1}{2\pi C r_\pi} \quad [4]$$

where ~ indicates proportional to;
$r_\pi$ is calculated according to Expression [3]; and
C is the capacitance of capacitors 118, 120.

Figure 4:
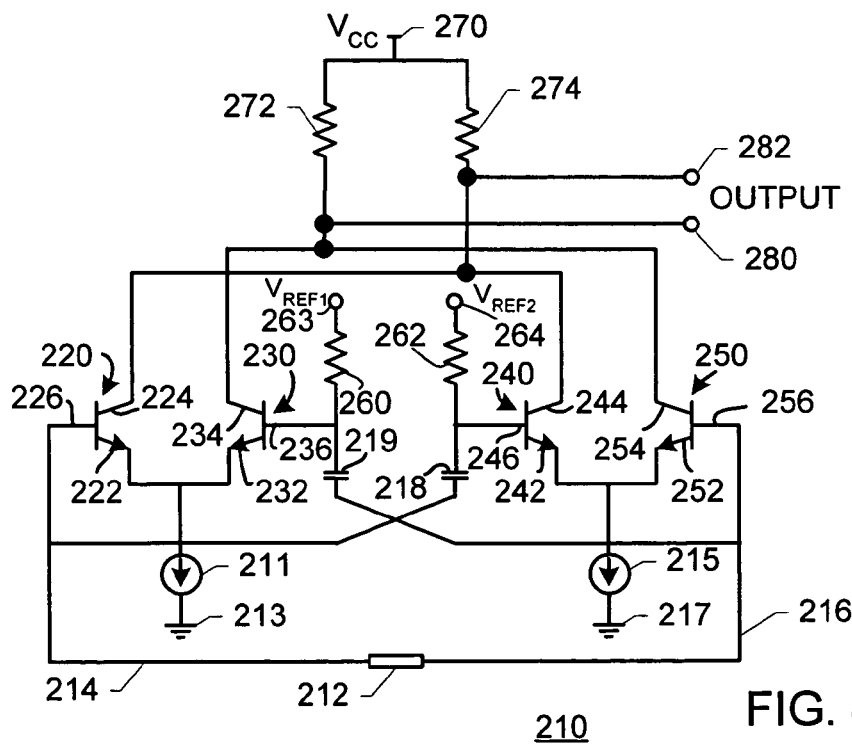
FIG. 4 is an electrical schematic illustration of a third example of a prior art differential amplifier for use with a read head.

FIG. 4 is an electrical schematic illustration of a third example of a prior art differential amplifier for use with a read head. In FIG. 4, a read amplifier circuit 210 (sometimes also referred to as a read front-end) is attached to a magneto-resistive element 212 via connection leads 214, 216 connected in parallel. A capacitor 218 is coupled with connection lead 214. A capacitor 219 is coupled with connection lead 216. Capacitors 218, 219 block low frequency signals that appear on connection leads 214, 216.

A bipolar transistor 220 has an emitter 222, a collector 224 and a base 226. A bipolar transistor 230 has an emitter 232, a collector 234 and a base 236. A bipolar transistor 240 has an emitter 242, a collector 244 and a base 246. A bipolar transistor 250 has an emitter 252, a collector 254 and a base 256. Emitters 222, 232 are coupled in common and with a ground locus 213 via a current source 211. Emitters 242, 252 are coupled in common and with a ground locus 217 via a current source 215. Base 226 is coupled with connection lead 214. Base 246 is connected with connection lead 214 via capacitor 218. Base 256 is coupled with connection lead 216. Base 236 is connected with connection lead 216 via capacitor 219. Collectors 224, 244 are coupled in common and are coupled with a supply voltage $V_{CC}$ at a supply voltage locus 270 via a resistor 274. Collectors 234, 254 are coupled in common and are coupled with supply voltage $V_{CC}$ at supply voltage locus 270 via a resistor 272. Base 236 is connected with a reference voltage $V_{REF1}$ at a reference voltage locus 263 via a resistor 260. Base 246 is connected with reference voltage $V_{REF2}$ at reference voltage locus 264 via a resistor 262. Output signals are taken from collectors 224, 244 connected in common and taken from collectors 234, 254 connected in common and presented at output loci 280, 282.

Amplifier circuit 210 is improved over amplifier circuit 110 (FIG. 3) in that cross-coupling of capacitors 218, 219 results in low corner frequency $f_{LF}$ (for a given capacitor size) being determined by the relationship:

$$f_{LF} \sim \frac{1}{2\pi C(4r_\pi)} \quad [5]$$

Capacitance (C) of capacitors 218, 219 in amplifier circuit 210 {expression [5]) may be significantly smaller—on the order of one-fourth—than capacitors 118, 120 (FIG. 3; expression [3]) to yield the same low corner frequency $f_{LF}$. Lower valued capacitors means smaller die size, which is advantageous. Moreover, smaller capacitors 218, 219 means that fewer parasitics are present so that better high frequency performance is experienced having better bandwidth and lower high frequency noise in amplifier circuit 210 than are experienced in amplifier circuit 110 (FIG. 3).

However, amplifier circuit 210 still has the problem of bipolar transistor noise operating counter to improving low corner frequency $f_{LF}$, as discussed in connection with amplifier circuit 110 (FIG. 3) and expressions [2], [3] and [4] above.

Figure 5:
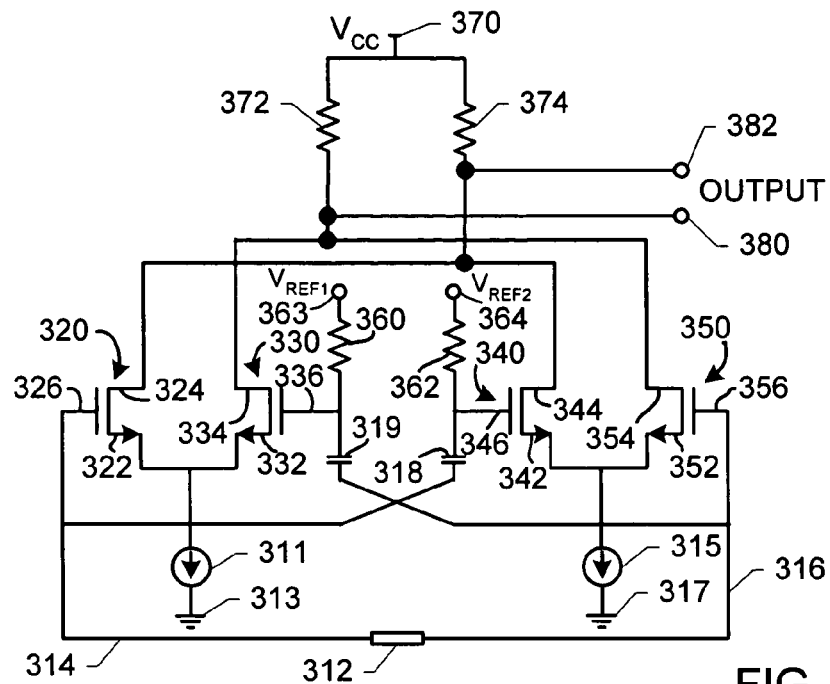
FIG. 5 is an electrical schematic illustration of a fourth example of a prior art differential amplifier for use with a read head.

FIG. 5 is an electrical schematic illustration of a fourth example of a prior art differential amplifier for use with a read head. In FIG. 5, a read amplifier circuit 310 (sometimes also referred to as a read front-end) is attached to a magneto-resistive element 312 via connection leads 314, 316 connected in parallel. A capacitor 318 is coupled with connection lead 314. A capacitor 319 is coupled with connection lead 316. Capacitors 318, 319 block low frequency signals that appear on connection leads 314, 316.

A metal-oxide silicon (MOS) transistor 320 has a source 322, a drain 324 and a gate 326. A MOS transistor 330 has a source 332, a drain 334 and a gate 336. A MOS transistor 340 has a source 342, a drain 344 and a gate 346. A MOS transistor 350 has a source 352, a drain 354 and a gate 356. Sources 322, 332 are coupled in common and with a ground locus 313 via a current source 311. Sources 342, 352 are coupled in common and with a ground locus 317 via a current source 315. Gate 326 is coupled with connection lead 314. Gate 346 is connected with connection lead 314 via capacitor 318. Gate 356 is coupled with connection lead 316. Gate 336 is connected with connection lead 316 via capacitor 319. Drains 324, 344 are coupled in common and are coupled with a supply voltage $V_{CC}$ at a supply voltage locus 370 via a resistor 374. Drains 334, 354 are coupled in common and are coupled with supply voltage $V_{CC}$ at supply voltage locus 370 via a resistor 372. Gate 336 is connected with a reference voltage $V_{REF1}$ at a reference voltage locus 363 via a resistor 360. Gate 346 is connected with reference voltage $V_{REF2}$ at reference voltage locus 364 via a resistor 362. Output signals are taken from drains 324, 344 connected in common and taken from drains 334, 354 connected in common and presented at output loci 380, 382.

Amplifier circuit 310 enjoys advantages similar to advantages experienced by amplifier circuit 210 (FIG. 4) because of the cross-coupling of capacitors 318, 319. That is, capacitors 318, 319 in amplifier circuit 310 may be significantly smaller—on the order of one-fourth—than capacitors 118, 120 (FIG. 3) to yield the same low corner frequency $f_{LF}$. Lower valued capacitors means smaller die size. Moreover, smaller capacitors 318, 319 means that fewer parasitics present so that better high frequency performance having better bandwidth and lower high frequency noise is experienced in amplifier circuit 310 as compared with amplifier circuit 110 (FIG. 3). Amplifier circuit 310 enjoys further advantages similar to amplifier circuit 10 (FIG. 2) in that setting of low corner frequency $f_{LF}$ is independent of the currents or physical dimensions of MOS transistors 320, 330, 340, 350. However, noise characteristics of amplifier circuit 310 are not as good as noise characteristics of amplifier circuit 110 (FIG. 3) or amplifier circuit 210 (FIG. 4).

The present invention combines advantages of bipolar and MOS transistor implementations of amplifier circuits. This design proved difficult to achieve because balanced performance by bipolar and MOS transistors must be achieved. The preferred embodiment of the amplifier circuit of the present invention employs asymmetric amplifier structures in each of two parallel circuit segments that operate symmetrically and cooperate to effect balanced signal amplification overall.

Figure 6:
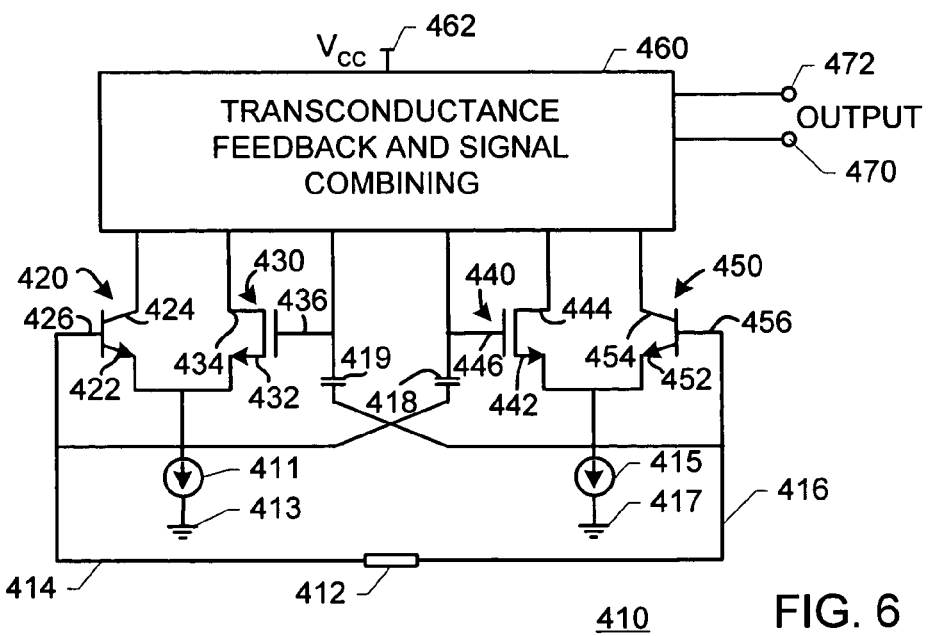
FIG. 6 is an electrical schematic illustration of the differential amplifier of the present invention.

FIG. 6 is an electrical schematic illustration of the differential amplifier of the present invention. In FIG. 6, a read amplifier circuit 410 (sometimes also referred to as a read front-end) is attached to a magneto-resistive element 412 via connection leads 414, 416 connected in parallel. A capacitor 418 is coupled with connection lead 414. A capacitor 419 is coupled with connection lead 416. Capacitors 418, 419 block low frequency signals that appear on connection leads 414, 416.

A bipolar transistor 420 has an emitter 422, a collector 424 and a base 426. A MOS transistor 430 has a source 432, a drain 434 and a gate 436. A bipolar transistor 450 has an emitter 452, a collector 454 and a base 456. A MOS transistor 440 has a source 442, a drain 444 and a gate 446. Emitter 422 and source 432 are coupled in common and with a ground locus 413 via a current source 411. Emitter 452 and source 442 are coupled in common and with a ground locus 417 via a current source 415. Base 426 is coupled with connection lead 414. Gate 446 is connected with connection lead 414 via capacitor 418. Base 456 is coupled with connection lead 416. Gate 436 is connected with connection lead 416 via capacitor 419. Collectors 424, 454, drains 434, 444 and gates 436, 446 are coupled with a transconductance feedback and signal combining unit 460 (hereinafter referred to as feedback/combining unit 460). Feedback/combining unit 460 is coupled with a supply voltage $V_{CC}$ at a supply voltage locus 462 and coupled with output loci 470, 472 at which output signals are presented.

Feedback/combining unit provides feedback to gates 436, 446 to ensure balanced performance for each MOS/bipolar transistor pair 430/420 and 440/450. Amplifier circuit 410 has advantages from using MOS transistors 430, 440 in that low corner frequency $f_{LF}$ is set substantially independent of the currents or physical dimensions of MOS transistors 430, 440. Amplifier circuit 410 has advantages from using bipolar transistors 420, 450 in that noise is partly determined by expressions [2] and [3], but requiring high $I_C$ does not conflict achieving a low corner frequency $f_{LF}$. This is so because low corner frequency $f_{LF}$ is substantially set by transconductance feedback from feedback/combining unit 460 so the need for high $r_\pi$ (which is counter to the need for high $I_C$ to reduce noise) for a bipolar transistor to yield a low corner frequency $f_{LF}$ is not a consideration.

Figure 7:
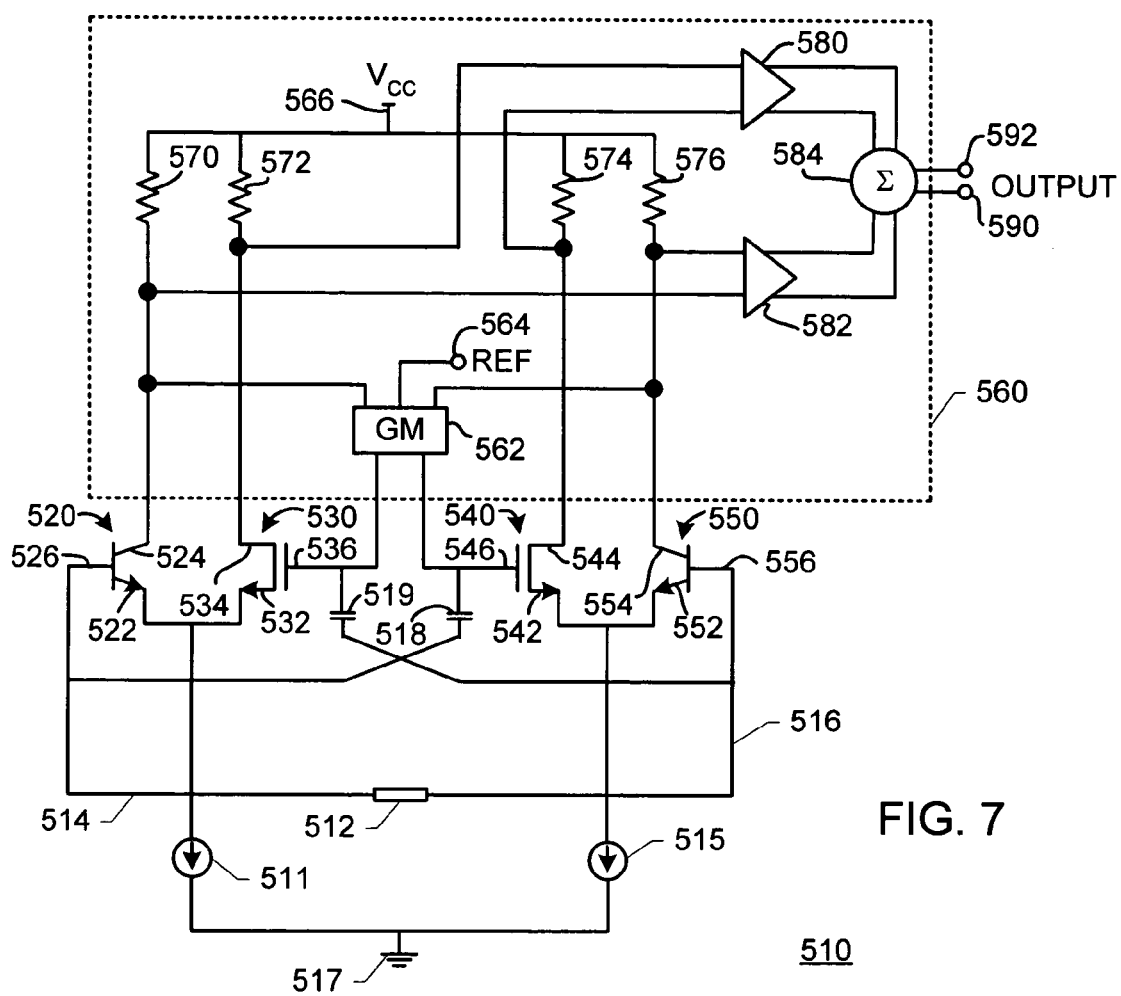
FIG. 7 is an electrical schematic illustration of the preferred embodiment of the differential amplifier of the present invention.

FIG. 7 is an electrical schematic illustration of the preferred embodiment of the differential amplifier of the present invention. In FIG. 7, a read amplifier circuit 510 (sometimes also referred to as a read front-end) is attached to a magneto-resistive element 512 via connection leads 514, 516 connected in parallel. A capacitor 518 is coupled with connection lead 514. A capacitor 519 is coupled with connection lead 516. Capacitors 518, 519 block low frequency signals that appear on connection leads 514, 516.

A bipolar transistor 520 has an emitter 522, a collector 524 and a base 526. A MOS transistor 530 has a source 532, a drain 534 and a gate 536. A bipolar transistor 550 has an emitter 552, a collector 554 and a base 556. A MOS transistor 540 has a source 542, a drain 544 and a gate 546. Emitter 522 and source 432 are coupled in common and with a ground locus 517 via a current source 511. Emitter 552 and source 542 are coupled in common and with a ground locus 517 via a current source 515. Base 526 is coupled with connection lead 514. Gate 546 is connected with connection lead 514 via capacitor 518. Base 556 is coupled with connection lead 516. Gate 536 is connected with connection lead 516 via capacitor 519. Collectors 524, 554, drains 534, 544 and gates 536, 546 are coupled with a transconductance feedback and signal combining unit 560 (hereinafter referred to as feedback/combining unit 560). Feedback/combining unit 560 includes a transconductance unit 562 connected with collectors 524, 554, connected with gates 536, 546 and connected with a reference voltage $V_{REF}$ at a reference voltage locus 564.

Transconductance unit 562 provides an error current to gates 536, 546 that is related with voltages received at collectors 524, 554. Transconductance unit 562 provides the required feedback to adjust collector currents at collectors 524, 554 and drain currents at drains 534, 544 to cause bipolar transistors 520, 550 to operate substantially symmetrically and to cause MOS transistors 530, 540 to operate substantially symmetrically.

Collector 524 is coupled with a supply voltage $V_{CC}$ at a supply voltage locus 566 via a resistor 570. Drain 534 is coupled with supply voltage $V_{CC}$ at supply voltage locus 566 via a resistor 572. Drain 544 is coupled with supply voltage $V_{CC}$ at supply voltage locus 566 via a resistor 574. Collector 554 is coupled with supply voltage $V_{CC}$ at supply voltage locus 566 via a resistor 576.

An amplifier 580 is connected to receive output signals from between resistor 572 and drain 534, and is also connected to receive output signals from between resistor 574 and drain 544. An amplifier 582 is connected to receive output signals from between resistor 570 and collector 524, and is also connected to receive output signals from between resistor 576 and collector 554. Thus, each of amplifiers 580, 582 receives inputs from only one type of transistor-amplifier 580 receives inputs from MOS transistors 530, 540 and amplifier 582 receives inputs from bipolar transistors 520, 550. Amplified signals are provided by amplifiers 580, 582 to a summer 584. Summer 584 is coupled with output loci 590, 592 at which output signals are presented.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims.

We claim:

1. An amplifier apparatus for use with a sensor; the apparatus comprising:
   (a) a first amplifying circuit segment and a second amplifying circuit segment; said first and second amplifying circuit segments being coupled with said sensor and cooperating to effect substantially balanced handling of signals received from said sensor; each of said first and second amplifying circuit segments including a first transistor device coupled in parallel with a second transistor device;
   (b) a feedback unit coupled with said first and second amplifying circuit segments; said feedback unit receiving signals from each of said first transistor device and said second transistor device in each of said first and second amplifier circuit segments; said feedback unit providing feedback signals to at least one of said first transistor device and said second transistor device in each of said first and second amplifier circuits to effect substantially balanced signal handling of signals by said first transistor device in each of said first and second amplifying circuit segments and to effect substantially balanced signal handling of signals by said second transistor device in each of said first and second amplifying circuit segments,
   wherein said first transistor devices are metal-oxide transistor devices and wherein said second transistor devices are a bipolar transistor devices.

2. An amplifier apparatus for use with a sensor as recited in claim 1 wherein said sensor is a read head in a data storage device.

3. An apparatus for use with a sensor; the apparatus comprising:
   (a) a first signal treating circuit segment and a second signal treating circuit segment; said first and second signal treating circuit segments being coupled with said sensor for presenting a substantially balanced differential signaling representation of output signals from said sensor; each respective signal treating circuit segment of said first and second signal treating circuit segments comprising first and second circuit elements coupled in parallel, said first circuit elements having symmetric signal handling characteristics, said second circuit elements having symmetric signal handling characteristics, said first and second circuit elements having asymmetric signal handling characteristics, said first and second circuit elements in each respective signal treating circuit segment of said first and second signal treating circuit segments coupled in parallel for establishing a plurality of parallel asymmetric signal paths; and
   (b) a feedback circuit coupled with said first and second signal treating circuit segments; said feedback circuit providing various feedback signals to said first and second circuit elements in each of said first and second signal treating circuit segments; said various feedback signals effect operating said first circuit elements in substantial symmetry and said second circuit elements in substantial symmetry,
   wherein said first circuit elements are metal-oxide transistors and said second circuit elements are bipolar transistors.

4. An apparatus for use with a sensor as recited in claim 3 wherein said sensor is a read head in an information storage device.

5. A differential amplifier apparatus for use with a sensor; the apparatus comprising:
   (a) a differential signal handling unit coupled with said sensor and including two signal handling sections receiving read signals from said sensor; said two signal handling sections effecting substantially balanced signal handling of said read signals to establish said differential signal handling; each respective signal handling section of said two signal handling sections including first and second semiconductor circuit elements coupled in parallel; said first semiconductor circuit elements having like signal handling characteristics, said second semiconductor circuit elements having like signal handling characteristics, said first and second semiconductor circuit elements of each signal handling section of said two signal handling sections having different signal handling characteristics; and
   (b) a feedback unit coupled with said differential signal handling unit; said feedback unit providing at least one feedback signal to said differential signal handling unit to effect operating said first semiconductor circuit elements in substantial symmetry and said second semiconductor circuit elements in substantial symmetry,
   wherein said first semiconductor circuit elements are metal-oxide transistors and said second semiconductor circuit elements are bipolar transistors.

6. A differential amplifier apparatus for use with a sensor as recited in claim 5 wherein said sensor is a read head in an information storage device.

\* \* \* \* \*